United States Patent
Jung et al.

(10) Patent No.: US 10,613,975 B2
(45) Date of Patent: Apr. 7, 2020

(54) METHOD OF DYNAMIC GARBAGE COLLECTION FOR A MEMORY DEVICE BASED ON VALID PAGE COUNT (VPC), GARBAGE COLLECTION SPEED, AND MAXIMUM AND MINIMUM OPERATING SPEEDS

(71) Applicant: SAMSUNG ELECTRONICS CO., LTD, Suwon-si, Gyeonggi-Do (KR)

(72) Inventors: Sang Won Jung, Busan (KR); Young Pil Song, Hwaseong-si (KR); Ju-Young Lee, Seoul (KR); Jun Ho Ahn, Yongin-si (KR); Bum Hee Lee, Hwaseong-si (KR); Sung-Hyun Cho, Suwon-si (KR); In Tae Hwang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/134,849

(22) Filed: Sep. 18, 2018

(65) Prior Publication Data

US 2019/0121728 A1 Apr. 25, 2019

(30) Foreign Application Priority Data

Oct. 25, 2017 (KR) .................. 10-2017-0139344

(51) Int. Cl.
*G06F 12/02* (2006.01)
*G11C 16/32* (2006.01)

(52) U.S. Cl.
CPC ...... *G06F 12/0246* (2013.01); *G06F 12/0261* (2013.01); *G11C 16/32* (2013.01); *G06F 2212/1024* (2013.01); *G06F 2212/7205* (2013.01); *G06F 2212/7208* (2013.01); *G06F 2212/7209* (2013.01)

(58) Field of Classification Search
CPC ............ G06F 12/0246; G06F 12/0261; G06F 2212/1024; G06F 2212/7205; G06F 2212/7208; G06F 2212/7209; G11C 16/32
USPC .................. 707/813, 693; 711/103
See application file for complete search history.

(56) References Cited

U.S. PATENT DOCUMENTS

| | | | |
|---|---|---|---|
| 7,743,203 B2 | 6/2010 | France | |
| 7,773,413 B2 | 8/2010 | Shalvi | |
| 7,796,424 B2 | 9/2010 | Happ et al. | |
| 7,957,189 B2 | 6/2011 | Avraham et al. | |

(Continued)

FOREIGN PATENT DOCUMENTS

KR 1539895 G1 7/2015

*Primary Examiner* — Hong C Kim
(74) *Attorney, Agent, or Firm* — Volentine, Whitt & Francos, PLLC

(57) ABSTRACT

A memory device and a dynamic garbage collection method thereof are provided. The method includes receiving a minimum operating speed, ascertaining a reference valid page count ratio (VPC), using a maximum operating speed, the minimum operating speed, and a garbage collection speed, the reference VPC ratio being ascertained by the following formula 1 and determining whether to perform a garbage collection, using the reference VPC ratio and a current average VPC ratio. <Formula 1> $Vr = Gp(Jp-Mp)/(Jp*Mp+(Gp*(Jp-Mp)))$ Here, $Vr$ is the reference VPC ratio, $Gp$ is the garbage collection speed, $Jp$ is the maximum operating speed, and $Mp$ is the minimum operating speed.

20 Claims, 15 Drawing Sheets

(56) References Cited

U.S. PATENT DOCUMENTS

| | | |
|---|---|---|
| 8,213,255 B2 | 7/2012 | Hemink et al. |
| 8,238,185 B2 | 8/2012 | Lee et al. |
| 8,363,478 B1 | 1/2013 | Yang et al. |
| 8,392,476 B2 | 3/2013 | Asano et al. |
| 8,472,274 B2 | 6/2013 | Fai et al. |
| 8,542,537 B2 | 9/2013 | Parker |
| 8,576,651 B2 | 11/2013 | Scheuerlein et al. |
| 8,880,775 B2 | 11/2014 | Stefanus et al. |
| 9,639,463 B1 | 5/2017 | Kankani et al. |
| 9,652,381 B2 | 5/2017 | Higgins et al. |
| 9,652,382 B1* | 5/2017 | Subramanian ...... G06F 12/0246 |
| 9,658,880 B2 | 5/2017 | Gray et al. |
| 9,665,609 B2 | 5/2017 | Andrei et al. |
| 9,678,671 B2 | 6/2017 | Kang et al. |
| 2010/0074014 A1 | 3/2010 | Dunga et al. |
| 2012/0102259 A1 | 4/2012 | Goss et al. |
| 2012/0163092 A1 | 6/2012 | Jung et al. |
| 2015/0261671 A1* | 9/2015 | Chu ................ G06F 12/0246 711/103 |
| 2016/0188220 A1 | 6/2016 | Nemoto et al. |
| 2017/0102884 A1* | 4/2017 | Kim ................ G06F 3/0608 |
| 2017/0285945 A1* | 10/2017 | Kryvaltsevich ......... G06F 3/061 |
| 2018/0181346 A1* | 6/2018 | Kim ................ G06F 3/0659 |
| 2019/0018768 A1* | 1/2019 | Kim ................ G06F 12/0253 |
| 2019/0026224 A1* | 1/2019 | Koo ................ G06F 12/0253 |
| 2019/0095276 A1* | 3/2019 | Lin ................ G06F 11/1048 |
| 2019/0108891 A1* | 4/2019 | Lee ................ G11C 29/38 |
| 2019/0121733 A1* | 4/2019 | Jang ................ G06F 12/0253 |

\* cited by examiner

BLK

BLKb

METHOD OF DYNAMIC GARBAGE COLLECTION FOR A MEMORY DEVICE BASED ON VALID PAGE COUNT (VPC), GARBAGE COLLECTION SPEED, AND MAXIMUM AND MINIMUM OPERATING SPEEDS

CROSS-REFERENCE TO RELATED APPLICATION

This application claims priority from Korean Patent Application No. 10-2017-0139344 filed on Oct. 25, 2017 in the Korean Intellectual Property Office, and all the benefits accruing therefrom under 35 U.S.C. 119, the contents of which in its entirety are herein incorporated by reference.

BACKGROUND

1. Field of the Invention

The present invention relates to a memory device and a dynamic garbage collection method thereof.

2. Description of the Related Art

Semiconductor memory devices include volatile memory devices and nonvolatile memory devices. The read and write speeds of the volatile memory device are fast. Meanwhile, however, the volatile memory device may lose the stored contents when a power supply is turned off. In contrast, since the nonvolatile memory devices maintain the stored contents even when the power supply is turned off, the nonvolatile memory devices are used to store the contents needed to be maintained whether power is supplied or not.

For example, the volatile memory devices include a static RAM (SRAM), a dynamic RAM (DRAM), a synchronous DRAM (SDRAM), and the like. The nonvolatile memory devices maintain the stored contents even when the power supply is turned off. For example, the nonvolatile memory device may be a ROM (read only memory), a programmable ROM (PROM), an electrically programmable ROM (EPROM), an electrically erasable programmable ROM (EEPROM), a flash memory, a phase change RAM (PRAM), a magnetic RAM (MRAM), a resistive RAM (RRAM), a ferroelectric RAM (FRAM) and the like. The flash memory may be classified into a NOR type flash memory and a NAND type flash memory.

In particular, the flash memory devices have the advantage of being able to be provided as a high-integrated auxiliary mass storage device and the like, as compared to a general EEPROM.

Various memory systems are produced using a flash memory. The memory system may store data in the flash memory or may read data from the flash memory via a protocol.

The storage devices that use the flash memory as a storage medium are considered to have increased lifetime, less power consumption, and better access time, as compared to storage devices that include disk drives.

Such a flash memory may perform garbage collection operations in order to secure free blocks of memory cells for storing data. Depending on the execution timing of the garbage collection, the performance of the flash memory may suddenly drop during the garbage collection. Accordingly, a way of controlling this sudden drop in performance is needed.

SUMMARY

An aspect provides a memory device in which the minimum performance is ensured by dynamically controlling the execution timing of garbage collection.

Another aspect of the present invention provides a dynamic garbage collection method of a memory device in which the minimum performance is ensured by dynamically controlling the garbage collection execution timing.

However, aspects are not restricted to the one set forth herein. The above and other aspects will become more apparent to one of ordinary skill in the art to which the present invention pertains by referencing the detailed description given below.

According to an aspect of the present inventive concept, there is provided a dynamic garbage collection method of a memory device. The method comprises: receiving a minimum operating speed for the memory device; ascertaining a reference valid page count (VPC) ratio for the memory device, using a maximum operating speed for the memory device, the minimum operating speed for the memory device, and a garbage collection speed for the memory device, the reference VPC ratio being ascertained by a first formula 1; determining whether to perform a garbage collection operation for the memory device, based on the reference VPC ratio and a current average VPC ratio for the memory device; and performing the garbage collection operation for the memory device when it is determined to perform the garbage collection operation based on the reference VPC ratio for the memory device and the current average VPC ratio for the memory device, wherein the first formula is: $Vr = Gp(Jp-Mp)/(Jp*Mp+(Gp*(Jp-Mp)))$, where, $Vr$ is the reference VPC ratio, $Gp$ is the garbage collection speed, $Jp$ is the maximum operating speed, and $Mp$ is the minimum operating speed.

According to another aspect of the present inventive concept, there is provided a dynamic garbage collection method of a memory device. The method comprises: ascertaining a reference valid page count (VPC) ratio for the memory device, using a maximum operating speed for the memory device, a minimum operating speed for the memory device, and a garbage collection speed for the memory device; ascertaining a free block expectation on blocks of the memory device which have a VPC ratio which is less than or equal to the reference VPC ratio for the memory device; ascertaining the number of final necessary free blocks, using the current average VPC ratio for the memory device; comparing the free block expectation with the number of final necessary free blocks to determine whether to perform the current garbage collection operation for the memory device; and performing the garbage collection operation for the memory device when it is determined to perform the garbage collection operation based on a comparison of the free block expectation and the number of final necessary free blocks.

According to still another aspect of the present inventive concept, there is provided a dynamic garbage collection method of a memory device. The method comprises: receiving at the memory device from a host a first minimum operating speed for the memory device at a first time; ascertaining a first reference VPC ratio for the memory device, using a first maximum operating speed for the memory device, the first minimum operating speed for the memory device, and a first garbage collection speed for the memory device; determining whether to perform a first garbage collection operation for the memory device using the first reference valid page count (VPC) ratio for the memory device and a current first average VPC ratio for the memory device; and when it is determined not to perform the first garbage collection operation for the memory device: receiving at the memory device from a host a second minimum operating speed for the memory device at a second time different from the first time, ascertaining a second reference VPC ratio for the memory device, using a second maximum operating speed for the memory device, the second minimum operating speed for the memory device, and a second garbage collection speed for the memory device, determining whether to perform a second garbage collection for the memory device, using the second reference VPC ratio for the memory device and a current second average VPC ratio for the memory device, and performing the second garbage collection operation for the memory device when it is determined to perform the second garbage collection operation based on a comparison of the second reference VPC ratio for the memory device and the current second average VPC ratio for the memory device.

According to a further aspect of the present inventive concept, there is provided a memory device comprising a nonvolatile memory and a memory controller connected to the nonvolatile memory and a host. The memory controller includes a garbage collection trigger which is configured to receive a maximum operating speed for the memory device, a minimum operating speed for the memory device, and a garbage collection speed for the memory device, and is configured to ascertain a reference valid page count (VPC) ratio for the memory device, to determine whether to perform a garbage collection operation for the nonvolatile memory, using the reference VPC ratio for the memory device and a current average VPC ratio for the memory device, and to generate a garbage collection trigger signal, and a garbage collection executor which is configured to receive the garbage collection trigger signal and in response thereto to perform the garbage collection operation for the nonvolatile memory.

According to yet another aspect of the present inventive concept, a memory device, comprises: a nonvolatile memory; and a memory controller connected to the nonvolatile memory and to a host. The memory controller includes a garbage collection executor which is configured to provide a garbage collection signal to the nonvolatile memory to perform a garbage collection operation on the nonvolatile memory in response to the memory controller determining that the garbage collection operation should be performed for the nonvolatile memory, wherein the memory controller determines autonomously that the garbage collection operation should be performed for the nonvolatile memory, without the memory controller receiving any garbage collection instruction from the host, based on a maximum operating speed for the memory device, a minimum operating speed for the memory device, and a garbage collection speed for the memory device, and a current average valid page count (VPC) ratio for the nonvolatile memory.

BRIEF DESCRIPTION OF THE DRAWINGS

The above and other aspects and features will become more apparent by describing in detail exemplary embodiments thereof with reference to the attached drawings.

DETAILED DESCRIPTION OF THE EMBODIMENTS

Figure 1:
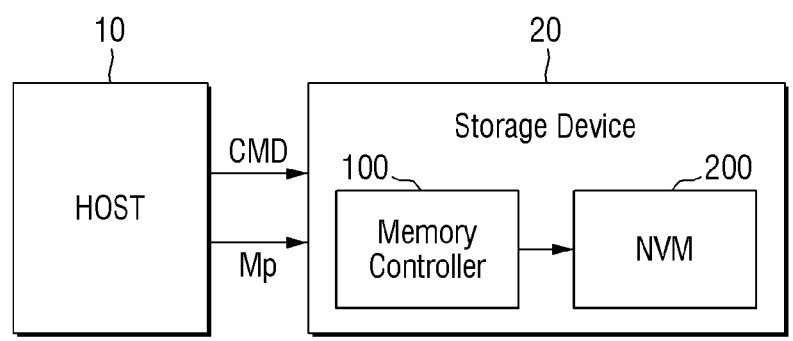
FIG. 1 is a block diagram illustrating a memory system including a memory device according to some embodiments.

Advantages and features and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

Hereinafter, a memory device according to some embodiments will be described with reference to FIGS. 1 to 12.

FIG. 1 is a block diagram illustrating a memory system including a memory device according to some embodiments.

Referring to FIG. 1, a memory system including a memory device 20 according to some embodiments includes a host 10 and the memory device 20.

Host 10 is connected to memory device 20 and may instruct memory device 20 to perform various operations. An operation instruction of host 10 may be made via a command (CMD). Host 10 may instruct memory device 20 to perform, for example, a read operation, a write operation, and an erase operation. However, the embodiment is not limited thereto.

Host 10 may transmit a minimum operating speed (Mp) to memory device 20. The minimum operating speed (Mp) may mean the minimum value of the operating speed of all operations including the read operation, the write operation, and the like of memory device 20. That is, host 10 may instruct memory device 20 not to operate at the speed less than the minimum operating speed, while presenting the minimum operating speed (Mp).

Memory device 20 is a storage medium in which a user stores data. For example, memory device 20 may be a solid state drive (SSD), a memory card (Compact Flash (CF), Secure Digital (SD), microSD, etc.), a universal serial bus (USB) storage device or the like.

In some embodiments, memory device 20 may comprise a nonvolatile memory device. The nonvolatile memory device may be a NAND flash memory, a vertical NAND flash memory (VNAND), a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM) or the like. Further, the nonvolatile memory device may be provided as a three-dimensional flash memory having a three-dimensional array structure. Memory device 20 may also be a charge trap flash (CTF) device in which the charge storage layer is made up of an insulating film, as well as a flash memory device in which a charge storage layer is made up of a conductive floating gate. Hereinafter, in the description to follow, memory device 20 is assumed to be a flash storage device provided as the flash memory device The command (CMD) and the minimum operating speed (Mp) may be transmitted to memory device 20 from host 10. Memory device 20 may internally include a memory controller 100 and a nonvolatile memory 200. Memory controller 100 and nonvolatile memory 200 will be described in detail below.

Figure 2:
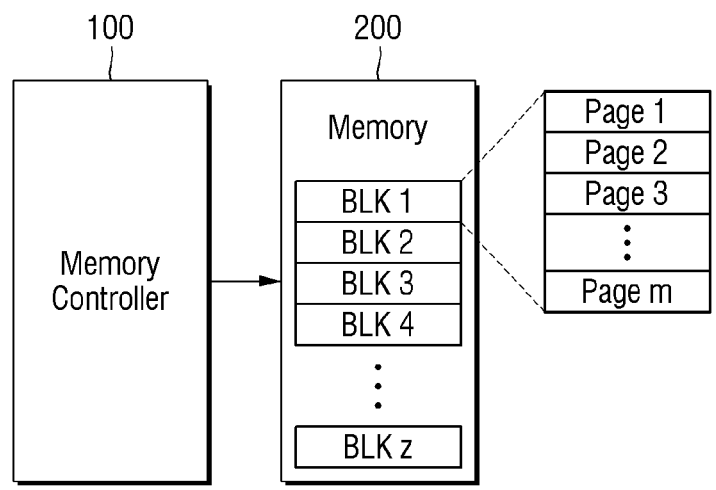
FIG. 2 is a block diagram illustrating the memory device of FIG. 1 in detail.

FIG. 2 is a block diagram illustrating the memory device of FIG. 1 in detail.

Referring to FIG. 2, nonvolatile memory 200 includes a plurality of memory blocks (BLK1 to BLKz, z is an integer of 2 or more). Each of the plurality of memory blocks (BLK1 to BLKz) includes a plurality of pages (Page 1 to Page m, m is an integer of 2 or more).

Figure 3:
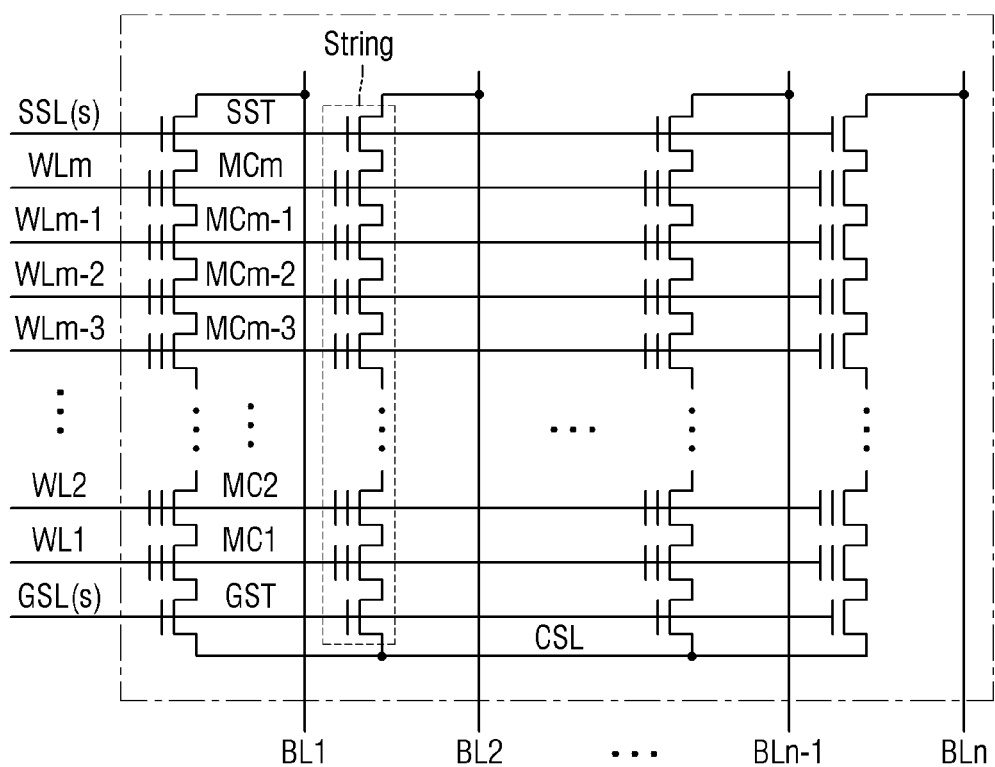
FIG. 3 is an exemplary equivalent circuit diagram of a memory block of the memory device according to some embodiments.

FIG. 3 is an exemplary equivalent circuit diagram of the memory block of the memory device according to some embodiments.

Referring to FIG. 3, the memory block (BLK) includes strings connected to a plurality of bit lines (BL1 to BLn, n is an integer of 2 or more). Here, each of the strings includes at least one string selection transistor (SST) connected in series between a bit line and a common source line (CSL), a plurality of memory cells (MC1 to MCm, m is an integer of 2 or more), and at least one ground selection transistor (GST).

Each of the memory cells (MC1 to MCm) may store data of at least one bit or more. Although it is not illustrated, each of the strings may further include at least one dummy cell between the string selection transistor (SST) and the memory cells (MC1 to MCm), and at least one dummy cell between the memory cells (MC1 to MCm) and the ground selection transistor (GST).

Figure 4:
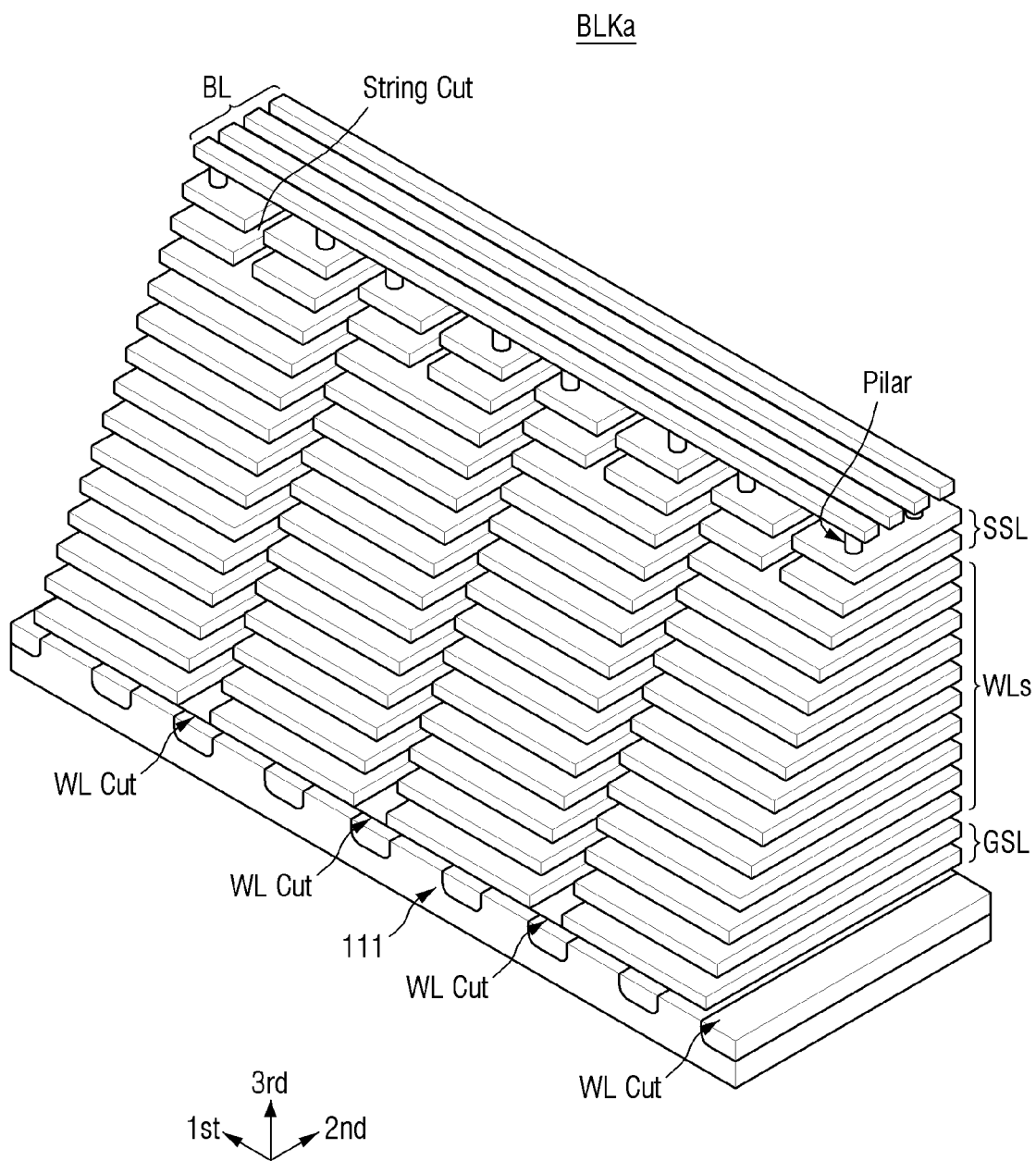
FIG. 4 is a perspective view of a memory block of the memory device according to some embodiments.

FIG. 4 is a perspective view of the memory block of the memory device according to some embodiments.

Referring to FIG. 4, four sub-blocks are formed on the substrate. Each of the sub-blocks is formed by stacking at least one ground selection line (GSL), a plurality of word lines (WLs), and at least one string selection line (SSL) in the form of plate on the substrate between the word line cuts (WL cut). Here, at least one string selection line (SSL) is separated into the string selection line cut (String Cut). On the other hand, in FIG. 4, there is a string selection line cut, but the memory block is not limited thereto. The memory block (BLKa) may be provided such that the string selection line cut does not exist.

A first direction (1st) and a second direction (2nd) intersect with each other, and a third direction (3rd) may intersect with the first direction (1st) and the second direction (2nd). The first direction (1st), the second direction (2nd), and the third direction (3rd) may be, for example, directions which are orthogonal to each other.

The ground selection line (GSL), the word lines (WLs), and the string selection line (SSL) extend in the second direction (2nd), and may be spaced apart from each other in the first direction (1st) by the word line cut and the string selection line cut. Further, the ground selection line (GSL), the word lines (WLs), and the string selection line (SSL) may be sequentially stacked in the third direction (3rd).

In some embodiments, at least one dummy word line may be stacked in the form of a plate between the ground selection line (GSL) and the word lines (WLs), or at least one dummy word line may be stacked in the form of a plate between the word lines (WLs) and the string selection line (SSL).

Although it is not illustrated, each word line cut includes a common source line (CSL). In the embodiment, the common source lines (CSL) included in each word line cut are commonly connected. Since a pillar connected to the bit line passes through at least one ground selection line (GSL), a plurality of word lines (WLs), and at least one string selection line (SSL), a string is formed.

In FIG. 4, the object between the word line cuts is illustrated as a sub-block, but embodiments are not necessarily limited thereto. The sub-block may nominate the object between word line cut and the string selection line cut as the sub-block.

The block (BLKa) according to the embodiment may be provided as structure in which two word lines are merged into one, in other words, merged word line structure.

Figure 5:
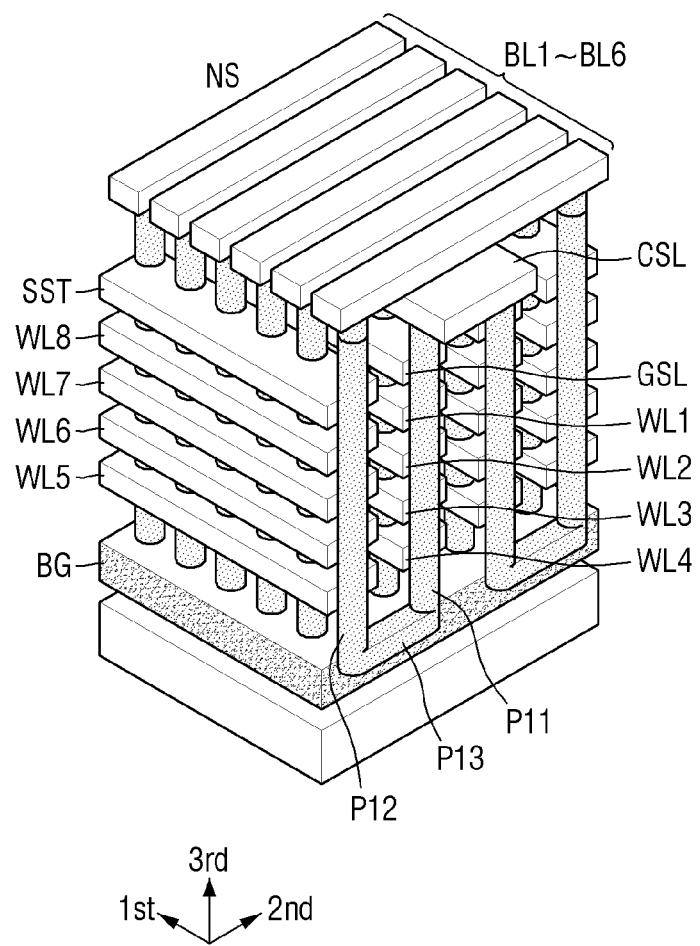
FIG. 5 is a cross-sectional perspective view of the memory block of the memory device according to some embodiments.

FIG. 5 is a cross-sectional perspective view of the memory block of the memory device according to some embodiments. The structure of the block (BLKb) of FIG. 5 may be different from the block (BLKa) structure of FIG. 4.

Referring to FIG. 5, for the sake of convenience of explanation, the number of floors of the word line is set as 4, but the memory block (BLKb) is not limited thereto. The memory block (BLKb) may be provided as a PBiCS (pipe-shaped bit cost scalable) structure in which the lower ends of adjacent memory cells connected in series are connected by pipes.

The memory block (BLKb) includes m×n (m and n are natural numbers) strings (NS). In FIG. 5, an example where m=6 and n=2 is illustrated. Each string (NS) includes memory cells (MC1 to MC8) connected in series. Here, the first upper ends of the memory cells (MC1 to MC8) are connected to the string selection transistor (SST), the second upper ends of the memory cells (MC1 to MC8) are connected to the ground selection transistor (GST), and the lower ends of the memory cells (MC1 to MC8) are connected by the pipes.

The word lines (WL1 to WL8) extend in the first direction (1st), and the strings (NS) may extend in the second direction (2nd). The word lines (WL1 to WL8) and the strings (NS) may be spaced apart from each other in the third direction (3rd).

Memory cells constituting the string (NS) are formed by being stacked on a plurality of semiconductor layers. Each string (NS) includes a first pillar (PL11), a second pillar (PL12), and a pillar connecting portion (PL13) which connects the first pillar (PL11) and the second pillar (PL12). The first pillar (PL11) is connected to a bit line (for example, BL1) and the pillar connecting portion (PL13), and is formed by penetrating between the string selection line (SSL) and the word lines (WL5 to WL8). The second pillar (PL12) is connected to the common source line (CSL) and the pillar connecting portion (PL13), and is formed by penetrating between the ground selection line (GSL) and the word lines (WL1 to WL4). As illustrated in FIG. 5, the string (NS) is provided in the form of a U-shaped pillar.

At this time, the first pillar (PL11) and the second pillar (PL12) extend in the third direction, and the pillar connecting portion (PL13) may be connected in the second direction (2nd).

In some embodiments, a back-gate (BG) is formed on the substrate, and the pillar connecting portion (PL13) may be provided inside the back-gate (BC). In the embodiment, the back gate (BG) may commonly exist in the block (BLKb). The back-gate (BG) may have a structure that is separated from the back-gate of the other block.

Figure 6:
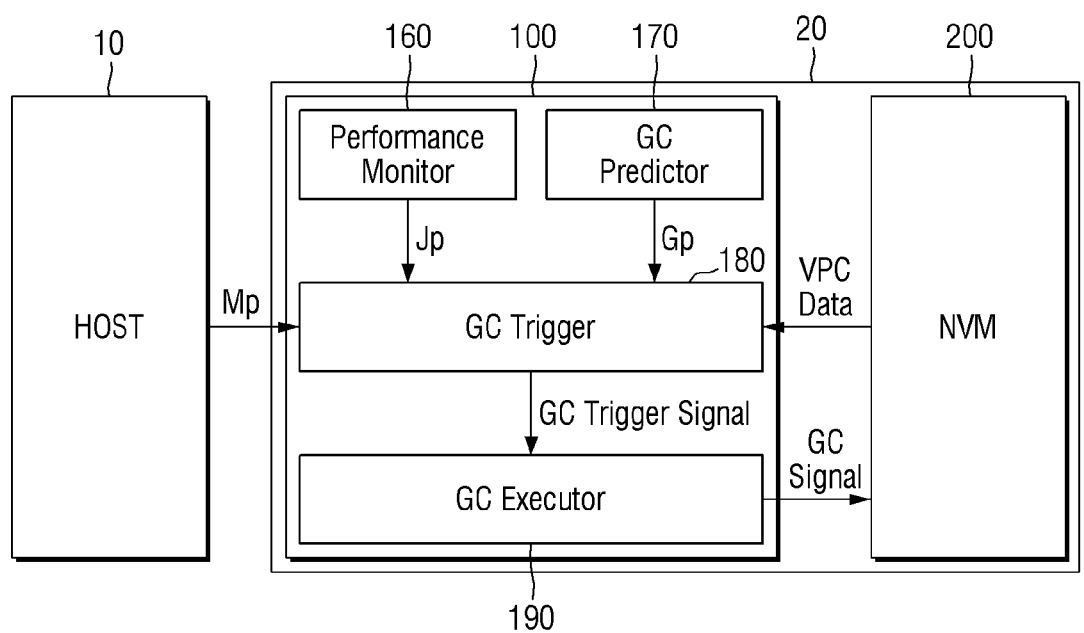
FIG. 6 is a block diagram illustrating a memory controller of the memory device according to some embodiments.

FIG. 6 is a block diagram illustrating the memory controller of the memory device according to some embodiments.

Referring to FIG. 6, memory controller 100 may include a performance monitor 160, a garbage collection predictor 170, a garbage collection trigger 180, and a garbage collection executor 190.

Performance monitor 160 may calculate or ascertain the maximum operating speed (Jp) of memory device 20. Performance monitor 160 may measure the current operating speed of memory device 20, and may derive the maximum operating speed (Jp) of memory device 20 using the current operating speed.

The maximum operating speed (Jp) may mean the maximum value of the free page amount consumed per second. Alternatively, the maximum operating speed (Jp) may also be defined as the maximum value of the dimension of the storage capacity consumed per second.

Since performance monitor 160 dynamically measures the current operating speed, the maximum operating speed (Jp) which is calculated or ascertained on the basis of the current operating speed may also be dynamically calculated or ascertained.

Performance monitor 160 may transmit the maximum operating speed (Jp) to garbage collection trigger 180. At this time, transmission of the maximum operating speed (Jp) may also be executed dynamically. That is, the latest maximum operating speed (Jp) which has been calculated or ascertained may be transmitted to garbage collection trigger 180 from performance monitor 160.

Garbage collection predictor 170 may predict the garbage collection speed (Gp). The speed of garbage collection may vary depending on the data arrangement structure of nonvolatile memory 200. Therefore, garbage collection predictor 170 may predict the garbage collection speed (Gp) in consideration of the data arrangement structure of nonvolatile memory 200.

The garbage collection speed (Gp) may mean the number of pages in which the garbage collection per second is completed. Alternatively, the garbage collection speed (Gp) may mean the dimension of the storage space in which garbage collection per second is completed.

Garbage collection predictor 170 may also dynamically predict the garbage collection speed (Gp). Garbage collection predictor 170 may transmit the garbage collection speed (Gp) to garbage collection trigger 180. At this time, the transmission of the garbage collection speed (Gp) may also be dynamically executed. That is, the latest garbage collection speed (Gp) which has been calculated or ascertained may be transmitted to garbage collection trigger 180 from garbage collection predictor 170.

The minimum operating speed (Mp) may be transmitted to garbage collection trigger 180 from host 10. The maximum operating speed (Jp) may be transmitted to garbage collection trigger 180 from performance monitor 160. The garbage collection speed may be transmitted to garbage collection trigger 180 from garbage collection predictor 170.

At this time, the minimum operating speed (Mp) may mean the minimum value of the free page amount consumed per second. Alternatively, the minimum operating speed (Mp) may also be defined as the minimum value of the dimension of the storage capacity consumed per second.

Garbage collection trigger 180 may derive the reference valid page count (VPC) ratio, using the minimum operating speed (Mp), the maximum operating speed (Jp), and the garbage collection speed (Gp).

Hereinafter, a method of deriving the reference VPC ratio (CP) by garbage collection trigger 180 will be described referring to FIGS. 7 to 9.

Figure 7:
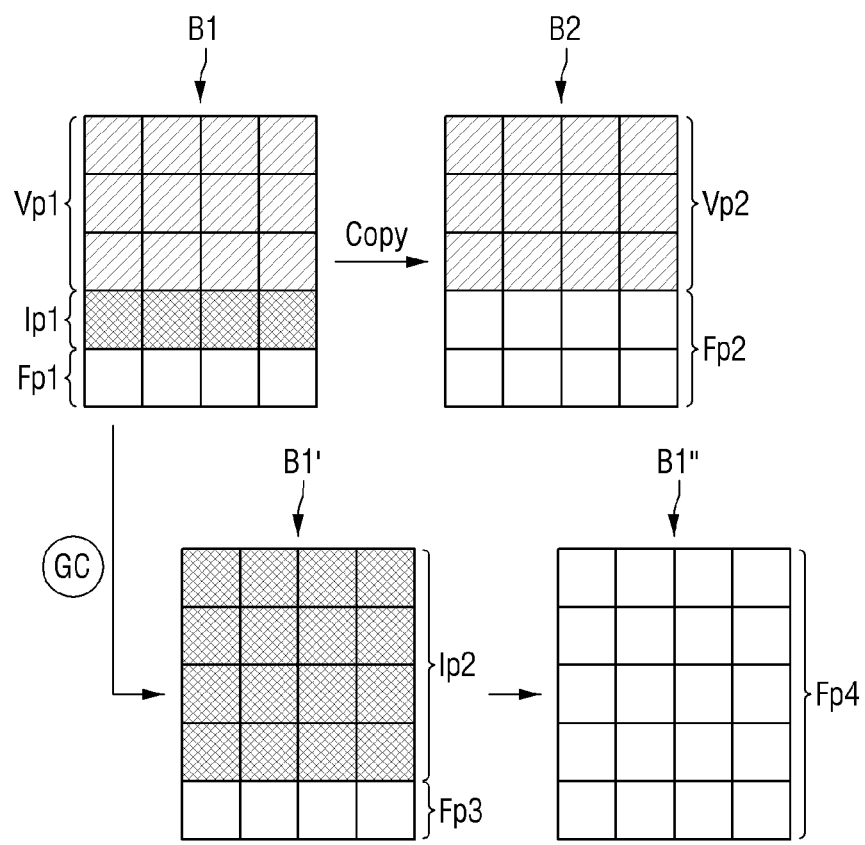
FIG. 7 is a conceptual diagram illustrating the garbage collection operation of the memory device according to some embodiments.
Figure 8:
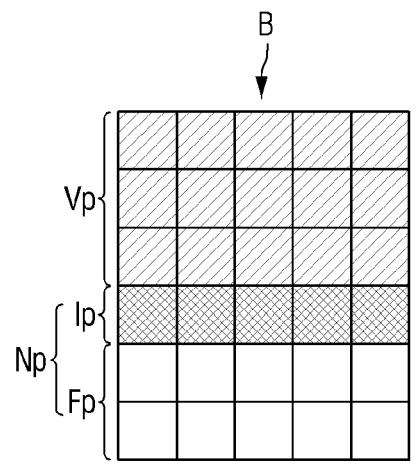
FIG. 8 is a conceptual diagram illustrating a VPC ratio of the memory device according to some embodiments.

FIG. 7 is a conceptual diagram illustrating the garbage collection operation of the memory device according to some embodiments, and FIG. 8 is a conceptual diagram illustrating the VPC ratio of the memory device according to some embodiments. FIG. 9 is a graph illustrating the distribution of the VPC ratio of the memory device according to some embodiments.

First, the method of garbage collection operation will be described referring to FIG. 7.

In nonvolatile memory 200, in particular, in the flash memory, there may be a difference between a logical free block recognized by host 10 and a physical free block actually existing in nonvolatile memory 200. This is because overwriting of data to the same logical address is not performed as a feature of the flash memory.

That is, when host 10 is requested to overwrite the data on the same logical address, the existing data remains as old data in stored at its existing physical address, and the new data may be written at the new physical address. In such a case, the old data merely remains in the state of filling the physical free block in the ineffective invalid state.

Therefore, host 10 may request a new write operation to an empty logical address, that is, a logical free block. However, actually, the physical free block is filled with the old data and may not exist. At this time, memory controller 100 may secure a physical free block corresponding to the logical free block through the garbage collection operation.

The first block (B1) of FIG. 7 may include a plurality of pages. A part of the plurality of pages includes first valid pages (Vp1) on which valid data is written, another part of the plurality of pages includes first invalid pages (Ip1) on which the data of the above-described invalid state is recorded, and the remainder of the plurality of pages may be first free page s(Fp1) on which no data is recorded. However, the above configuration is merely an example for explanation, and the actual configuration of the block may be any configuration including at least one of the invalid page, the valid page, and the free page.

When the garbage collection proceeds by memory controller 100, the first valid pages (Vp1) of the first block (B1) may be copied to another free block, i.e., the second block (B2). That is, the second block (B2) may include second valid pages (Vp2) in which the first valid pages (Vp1) have been copied. However, since the first invalid pages (Ip1) of the first block (B1) are not copied to the second block (B2), the second block (B2) may include only the first valid pages (Vp1), and the second free pages (Fp2) on which nothing is recorded.

The first block (B1) may be changed to the first conversion block (B1') by the garbage collection (GC). That is, both the first valid pages (Vp1) and the first invalid pages (Ip1) in the first block (B1) may be converted into second invalid pages (Ip2) in the first conversion block (B1'). The first free pages (Fp1) in the first block (B1) may remain as the third free page (Fp3) the first conversion block (B1'), on which nothing is recorded yet. Therefore, the first conversion block (B1') may include only the second invalid pages (Ip2) and the third free pages (Fp3).

The first conversion block (B1') may be changed later to the first conversion free block (B1") according to a command such as secure erase. That is, a block in which only invalid pages and free pages exist therein, without valid pages, may be changed to have only free pages as a whole. That is, the second invalid pages (Ip2) and the third free pages (Fp3) of the first conversion block (B1') may be converted to the fourth free pages (Fp4) of the first conversion free block (B1").

In the garbage collection operation, the data recorded on the first valid pages (Vp1) of the existing first block (B1) is moved to and preserved on the second valid pages of the second block (B2), but a free block may be secured by converting the first block (B1) into the first conversion free block (B1") including only the fourth free pages (Fp4).

Referring to FIG. 8, the block (B) may include at least one of valid pages (Vp), invalid pages (Ip), and free pages (Fp). As described above, a valid page (Vp) is a page on which valid data is recorded, and an invalid page (Ip) is a page on which invalid old data is recorded. A free page (Fp) is a page on which no data is recorded.

The invalid pages (Ip) and the free pages (Fp) together, excluding the valid pages (Vp), may be defined as non-valid pages (Np).

The Valid Page Count (VPC) ratio of the block (B) may mean the ratio of the valid pages (Vp) to the entire pages constituting the block (B).

That is, the VPC ratio may be defined by Formula 1.

$$Vr=Vp/(Vp+Np)=Vp/(Vp+Ip+Fp) \quad \text{[Formula 1]}$$

Here, Vr is the VPC ratio, Vp is the number of valid pages, Np is the number of non-valid pages, Ip is the number of invalid pages, and Fp is the number of free pages.

Figure 9:
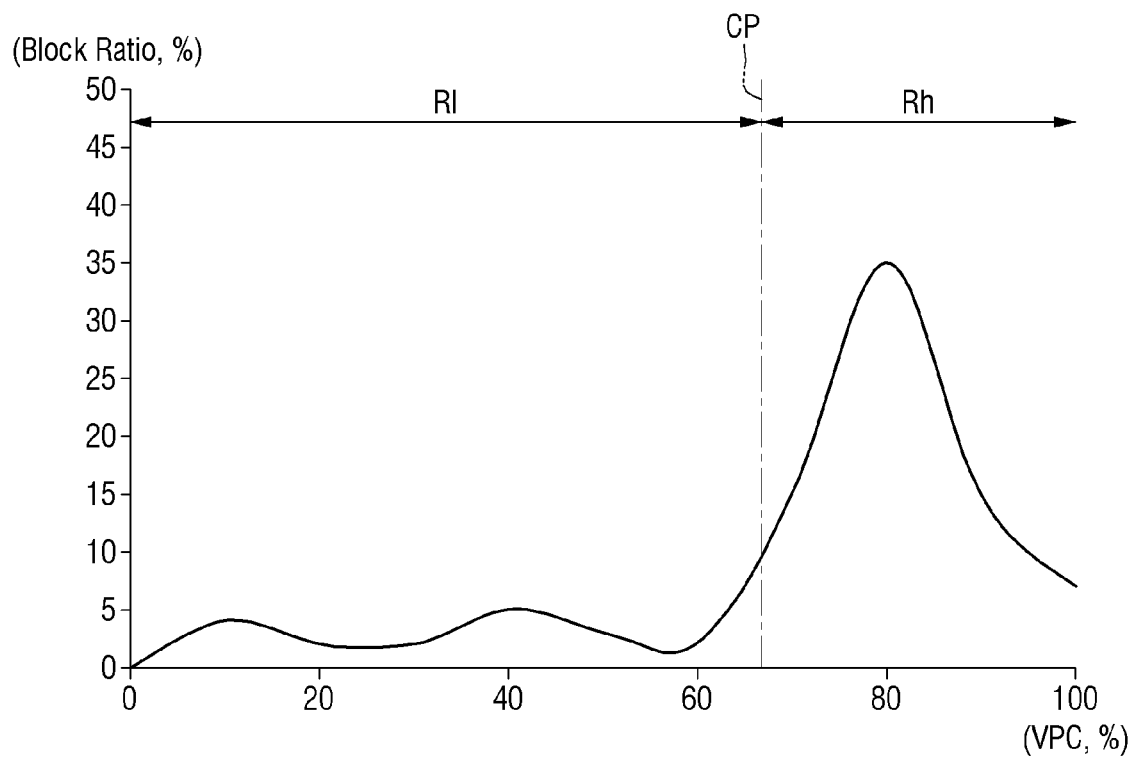
FIG. 9 is a graph illustrating a distribution of a VPC ratio of the memory device according to some embodiments.

Referring to FIG. 9, the distribution of blocks according to the VPC ratio may be checked. The reference VPC ratio (CP) is defined in the distribution as illustrated in FIG. 9, and regions may be divided accordingly.

Specifically, a block having a VPC ratio which is less than the reference VPC ratio (CP) may be located in a light region (R1), and a block having a VPC ratio higher than the reference VPC ratio (CP) may be located in a heavy region (Rh).

Referring to FIGS. 7 and 8, it is possible to know that a block with a small ratio valid pages (Vp), that is, a block with a low VPC ratio, may generate more free pages (Fp) by the garbage collection. Therefore, the garbage collection may be sequentially executed starting with the blocks with low VPC ratio. The reason is that in this way the efficiency of the garbage collection process may be maximized.

At this time, the efficiency of garbage collection may be defined by Formula 2.

$$GCeff=(1-Vr)/Vr \quad \text{[Formula 2]}$$

Here, GCeff is the efficiency of garbage collection, and Vr is the VPC ratio.

Referring again to FIG. 6, garbage collection trigger 180 may calculate or ascertain the free page production speed (Fp) as in the following Formula 3, using the garbage collection speed (Gp) transmitted from garbage collection predictor 170 and the efficiency of garbage collection.

$$Fp=Gp*GCeff=Gp*(1-Vr)/Vr \quad \text{[Formula 3]}$$

Here, Fp is the free page production speed, and Gp is the garbage collection speed.

At this time, Fp is the free page production speed which does not consider the minimum operating speed (Mp) of memory device 20. Memory device 20 may need to further reduce the garbage collection speed in order to ensure the minimum operating speed (Mp).

Therefore, when further multiplying the maximum operating speed (Jp) by the ratio of the value excluding the minimum operating speed (Mp) from the maximum operating speed (Jp), the actual free page production speed (Fpa), considering the minimum operating speed (Mp), may be obtained. This may be expressed by the following Formula 4.

$$Fpa=(1-(Mp/Jp))*Fp=(1-(Mp/Jp))*Gp*GCeff=(1-(Mp/Jp))*Gp*(1-Vr)/Vr \quad \text{[Formula 4]}$$

Here, Fpa is the actual free page production speed considering the minimum operating speed (Mp), Mp is the minimum operating speed (Mp) received by garbage collection trigger 180 from host 10, and Jp may be the maximum operating speed (Jp) acquired by performance monitor 160.

Garbage collection trigger 180 may calculate or ascertain the VPC ratio value for which the actual free page production speed is greater than the minimum operating speed (Mp) transmitted by host 10, that is, the minimum free page consumption speed. Such a condition may be expressed by the following Formula 5.

$$Fpa=(1-(Mp/Jp))*Gp*(1-Vr)/Vr>Mp \quad \text{[Formula 5]}$$

If both sides of the above inequality are arranged by Vr, it may be expressed by the following Formula 6.

$$Vr<Gp(Jp-Mp)/(Jp*Mp+(Gp*(Jp-Mp))) \quad \text{[Formula 6]}$$

As an example, when assuming that the maximum operating speed (Jp) is 48 MB/s, the minimum operating speed (Mp) is 8 MB/s, and the garbage collection speed is 24 MB/s, the relation of Vr<0.71 may be obtained. As a result, the reference VPC ratio (CP) may be 0.71.

Garbage collection trigger 180 may calculate or ascertain the maximum limit value of the VPC ratio value according to the condition like the Formula 6 as the reference VPC ratio (CP) of FIG. 9.

Garbage collection trigger 180 may determine whether the current garbage collection needs to be performed after calculating or ascertaining the reference VPC ratio (CP).

Garbage collection trigger 180 may receive the VPC data (VPC DATA) from nonvolatile memory 200. The VPC data (VPC DATA) may include data relating to VPC, such as the VPC ratio status of the blocks in nonvolatile memory 200 and the current average VPC ratio.

Hereinafter, how garbage collection trigger 180 determines whether to execute the garbage collection operation will be described referring to FIG. 10 and FIG. 11.

Figure 10:
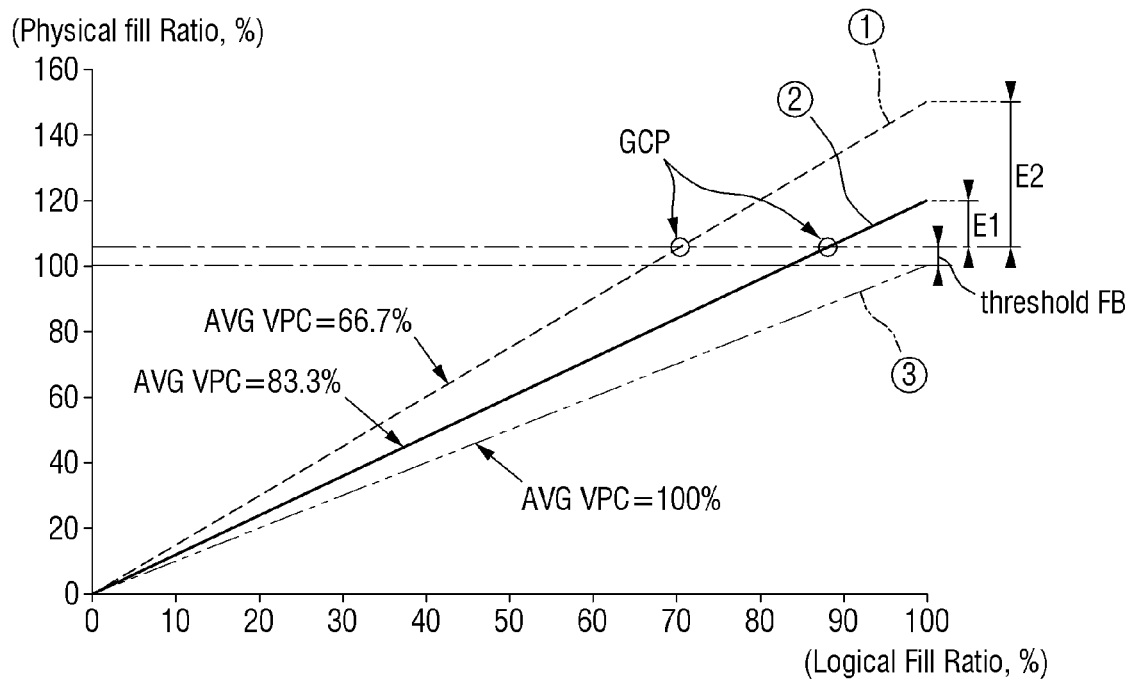
FIG. 10 is a graph illustrating a physical fill ratio to a logical fill ratio of the memory device according to some embodiments.
Figure 11:
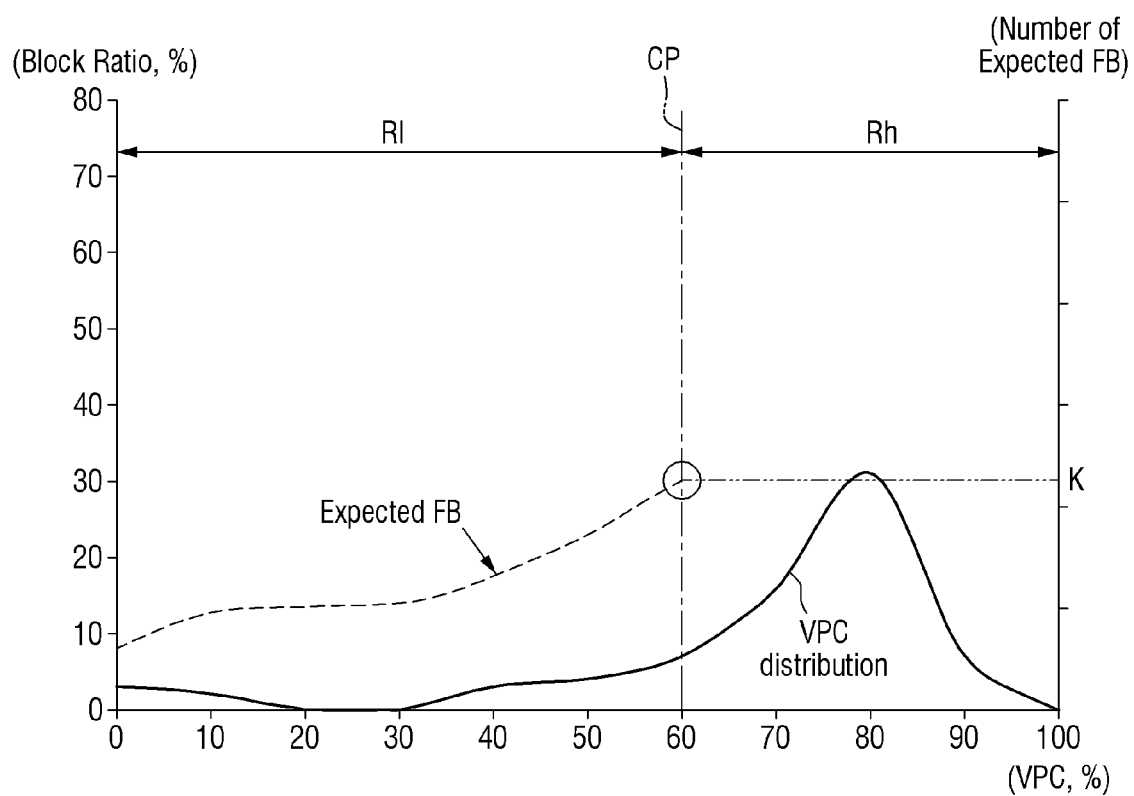
FIG. 11 is a graph illustrating the distribution of the VPC ratio and the free block expectation of the memory device according to some embodiments.

FIG. 10 is a graph illustrating a physical fill ratio to a logical fill ratio of the memory device according to some embodiments and FIG. 11 is a graph illustrating distribution of the a VPC ratio and the free block expectation of the memory device according to some embodiments.

The horizontal axis of the graph of FIG. 10 indicates the logical fill ratio, that is, the fill ratio of the logical space recognized by host 10. The vertical axis of the graph of FIG. 10 indicates the fill ratio of the physical space, that is, the physical fill ratio of the data in actual memory device 20.

If all the write operations of memory device 20 are sequential write operations rather than random write operations, that is, if the data is sequentially written even in the physical address without an intermediate blank page, the average VPC ratio may become 100% as illustrated in the graph of ③ of FIG. 10. In this case, since the existing physical blocks may replace all the logical blocks, the garbage collection may not be executed.

When a part of the write operations of memory device 20 is a random write operation, the average VPC ratio naturally has no choice but to be lower than 100%. ① of FIG. 10 is a graph in which the average VPC ratio is 66.7% and ② is a graph in which the average VPC ratio is 83.3%.

Since graphs ① and ② are graphs illustrated using the average VPC ratio at the current time, they may be different from the actual operation of memory device 20. That is, since the average VPC ratio at the current timing is a dynamic numerical value, it may change depending on the timing of measurement, but graphs ① and ② may illustrate the straight line graphs until the fill ratio of the logical space is 100% without taking these points into consideration.

Due to the possibility that the VPC is less than 100%, because the physical storage space is actually further required than the logical storage space, memory device 20 may have a physical space corresponding to the threshold free block (threshold FB). Therefore, the execution timing of general garbage collection may be a timing at which the fill ratio of the physical space is slightly higher than 100%, that is, the garbage collection point (GCP).

In graphs ② and ②, when the fill ratio of the logical space is 100%, the final physical space fill ratio of each graph may be calculated or ascertained. Of course, this is a value analogized by the current average VPC ratio, but it is possible to determine whether to perform the current garbage collection accordingly. The expected number of consumed blocks may be derived through the final physical space fill ratio.

Specifically, in the case of graph ①, by calculating or ascertaining the expected number of consumed blocks, and by excluding the total number of logical blocks (equal to the number of physical blocks corresponding to the fill ratio of 100% of the physical space) and the number of threshold blocks, the number of the final necessary free blocks may be calculated or ascertained. That is, the number of blocks corresponding to E2 may be the number of the final necessary free blocks.

Similarly, in the case of graph ②, by calculating or ascertaining the expected number of consumed blocks, and by excluding the total number of logical blocks and the number of threshold blocks therefrom, the number of the final necessary free blocks may be calculated or ascertained. That is, the number of blocks corresponding to E1 may be the number of the final necessary free blocks.

Referring to FIG. 11, when the garbage collection of the blocks of the write region (R1) which are less than the reference VPC ratio (CP) is executed, a graph of the free block expectation (Expected FB) may be illustrated.

Since the garbage collection is sequentially executed beginning with the blocks with the lowest VPC ratio, as the VPC ratio rises, the free block expectation (Expected FB) may naturally increase. The value (K) of the free block expectation (Expected FB) at the reference VPC ratio (CP) may mean the number of free blocks generated by the block having a VPC ratio which is less than the reference VPC ratio (CP).

At this time, the free block expectation may be derived by the sum of the invalid pages of the blocks having a VPC ratio which is less than the reference VPC ratio (CP).

Referring back to FIG. 6, garbage collection trigger 180 may compare the number of the final necessary free blocks of FIG. 10 with the free block expectation (K) of FIG. 11 to determine whether to perform the garbage collection operation.

Specifically, if the number of the final necessary free blocks is greater than the free block expectation, the garbage collection is executed to secure a free block. In contrast, if the number of the final necessary free blocks is less than the free block expectation, there is no need to perform the garbage collection operation.

However, since the maximum operating speed (Jp) and the garbage collection speed (Gp) received by garbage collection trigger 180 are dynamically determined, the values may change. Also, since the minimum operating speed (Mp) received from host 10 may also vary depending on the timing, even if the garbage collection operation is not executed at the current timing, the garbage collection operation may be performed according to determination at any later timing.

That is, even if the garbage collection operation is not executed by the aforementioned garbage collection execution determination at the first timing, the garbage collection execution determination is made in the same way at the second timing later than the first timing, and the garbage collection operation may be executed. Further, even when the garbage collection operation is not performed by the garbage collection execution determination performed at the second timing, the garbage collection execution determination is performed in the same way at the third timing, and the garbage collection operation may be performed.

That is, garbage collection trigger 180 may continue to dynamically determine whether to perform the garbage collection operation.

If it is determined that the garbage collection operation is executed by garbage collection trigger 180, that is, if the number of the final necessary free blocks is greater than the free block expectation, garbage collection trigger 180 may transmit a garbage collection trigger signal (GC trigger signal) to garbage collection executor 190.

Garbage collection executor 190 may receive the garbage collection trigger signal (GC trigger signal) from garbage collection trigger 180. When receiving the garbage collection trigger signal (GC trigger signal), garbage collection executor 190 may transmit the garbage collection signal (GC signal) to nonvolatile memory 200.

The garbage collection signal (GC signal) may be a signal that performs garbage collection of the nonvolatile memory 200. Therefore, the garbage collection of nonvolatile memory 200 may be executed.

Figure 12:
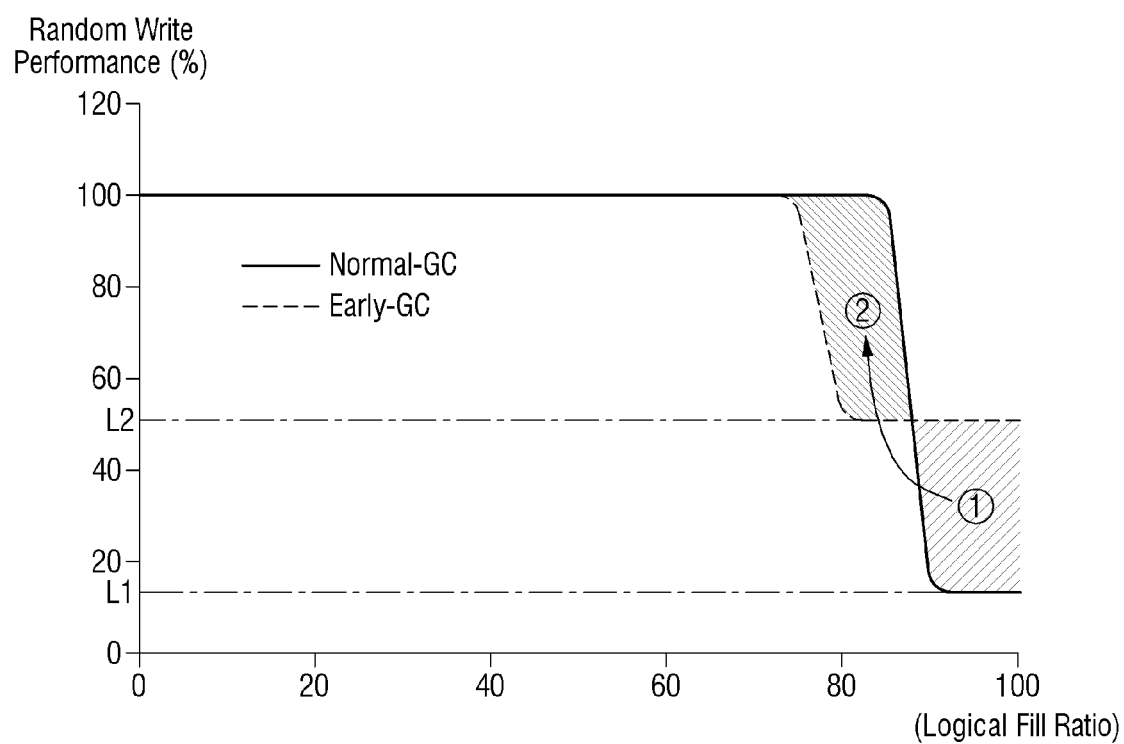
FIG. 12 is a graph illustrating random write performance to the logical fill ratio of the memory device according to some embodiments.

FIG. 12 is a graph illustrating a random write performance to the logical fill ratio of the memory device according to some embodiments.

Referring to FIG. 12, the random write performance of memory device 20 may be reduced to the first level (L1) when performing the general garbage collection (Noramal-GC). In the general garbage collection, because the garbage collection is performed after waiting until the time when the free block is completely required, the performance of memory device 20 may be reduced to the very low level (L1).

In such a case, since it takes too much time to execute the specific tasks requested by host 10, or there may be a situation where the specific tasks cannot be executed at all, there may be a need to secure the minimum operating speed.

The memory device according to some embodiments may perform the early garbage collection (early-GC) to preserve the minimum performance. Specifically, when performing the early garbage collection, the random write performance of memory device 20 may increase to the second level (L2). Of course, although there are side effects in which the random write performance declines even in the part in which the logical fill ratio is relatively low, while the performance degradation of ① in FIG. 12 is shifted to the performance degradation of ②, the minimum operating performance may be relatively improved.

That is, it is possible to secure the minimum operating speed for the specific task requested by the host. Accordingly, the host transmits the desired level of minimum operating speed to memory device 20, and memory device 20 may adjust the garbage collection viewpoint accordingly.

Hereinafter, the memory device according to some embodiments will be described referring to FIG. 13. The repeated part of the above description will be omitted or simplified.

Figure 13:
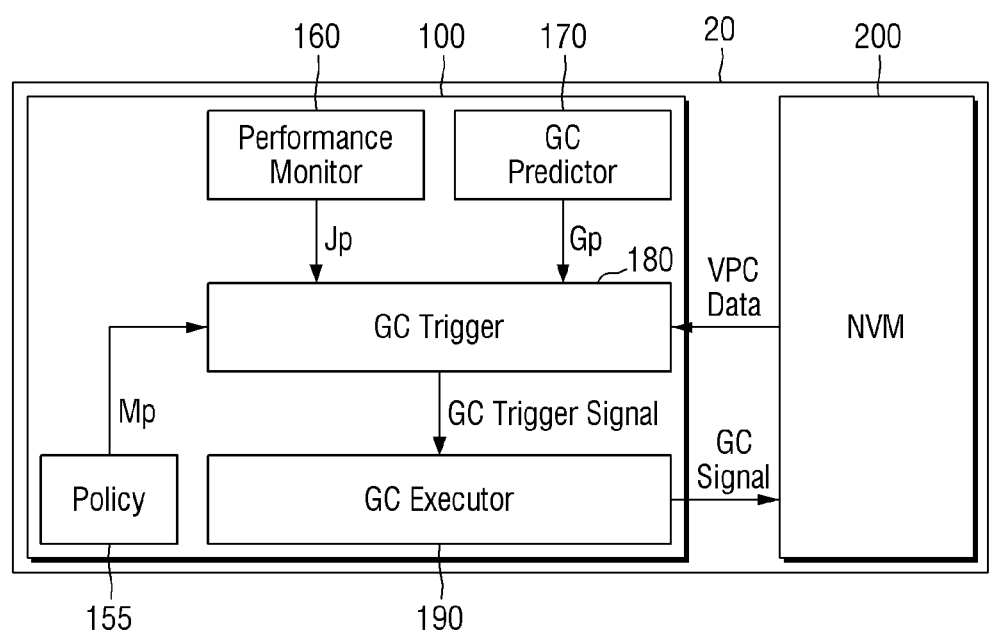
FIG. 13 is a block diagram illustrating a memory controller of the memory device according to some embodiments.

FIG. 13 is a block diagram illustrating the memory controller of the memory device according to some embodiments.

Referring to FIG. 13, the minimum operating speed is not transmitted to memory device 20 according to some embodiments from the host, and memory device 20 further includes a control policy 155.

Control policy 155 may be a preset policy built into the memory device in advance. control policy 155 may provide the preset minimum operating speed (Mp) to garbage collection trigger 180.

Control policy 155 may store the appropriate minimum operating speed (Mp) that is set when memory device 20 is fabricated. The minimum operating speed (Mp) according to control policy 155 may not change to a predetermined state.

The minimum operating speed (Mp) of control policy 155 of memory device 20 according to some embodiments may be changeable. That is, the minimum operating speed (Mp) may be determined depending on the current state of memory device 20. There may be various variables that determine the minimum operating speed (Mp).

For example, at least one of the temperature of memory device 20, the maximum operating speed (Jp), the garbage collection speed (Gp), and the program count of nonvolatile memory 200 may a variable that determines the minimum operating speed (Mp). However, the present embodiment is not limited thereto.

Memory device 20 according to the present embodiment does not depend on the minimum operating speed (Mp) received from the host, and memory device 20 itself determines whether to perform the garbage collection. Accordingly, memory device 20 reduces the burden on the host and may voluntarily execute the optimal operation.

Hereinafter, the memory device according to some embodiments will be described referring to FIG. 14. The repeated part of the above description will be omitted or simplified.

Figure 14:
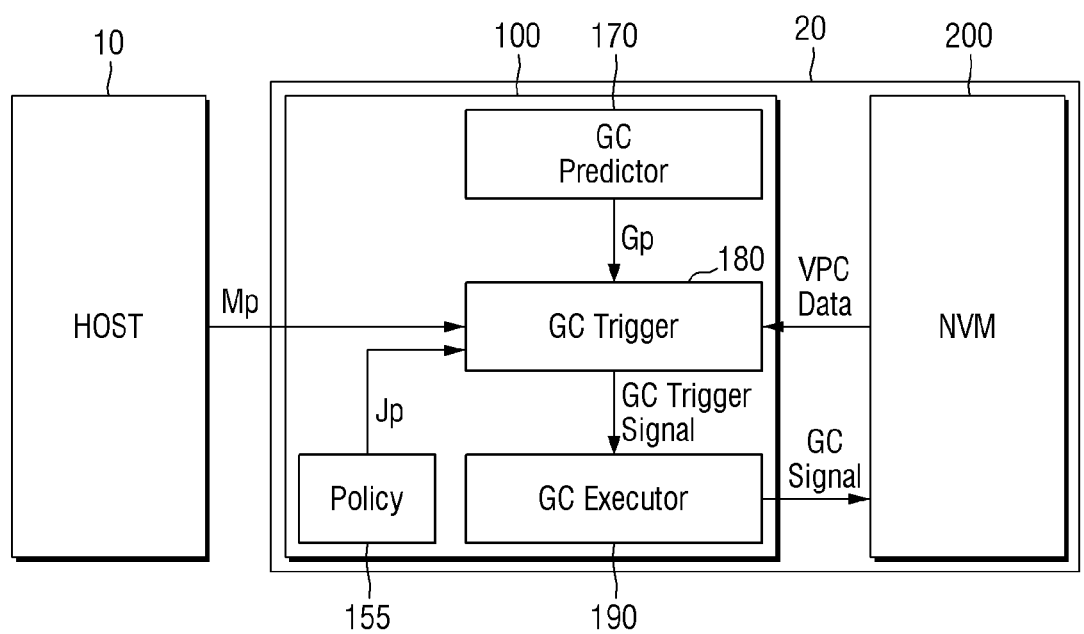
FIG. 14 is a block diagram illustrating the memory controller of the memory device according to some embodiments.

FIG. 14 is a block diagram illustrating a memory controller of a memory device according to some embodiments.

Referring to FIG. 14, memory device 20 according to some embodiments further includes a control policy 155, without receiving transmission of the maximum operating speed (Jp) from the performance monitor.

Control policy 155 may be built in the memory device in advance. Control policy 155 may provide the preset minimum operating speed (Mp) to garbage collection trigger 180.

Control policy 155 may store an appropriate maximum operating speed (Jp) which is set when memory device 20 is fabricated. The maximum operating speed (Jp) according to control policy 155 may not change to the predetermined state.

The maximum operating speed (Jp) of control policy 155 of memory device 20 according to some embodiments may be changeable. That is, the maximum operating speed (Jp) may be determined depending on the current state of memory device 20. There may be various variables that determine the maximum operating speed (Jp).

Instead of dynamically determining the maximum operating speed (Jp) through the current operating speed as in the performance monitor, some simple conditions may be considered to provide one of the several maximum operating speed (Jp) to garbage collection trigger 180.

Since memory device 20 according to the present embodiment does not need to separately measure the current operating speed and does not need to calculate or ascertain the maximum operating speed (Jp) which dynamically changes accordingly, the amount of calculations performed by overall memory device 20 may be reduced. As a result, since allocation of the limited resource may be efficiently performed, the overall performance of memory device 20 may be improved.

Hereinafter, the memory device according to some embodiments will be described referring to FIG. 15. The repeated part of the above description will be omitted or simplified.

Figure 15:
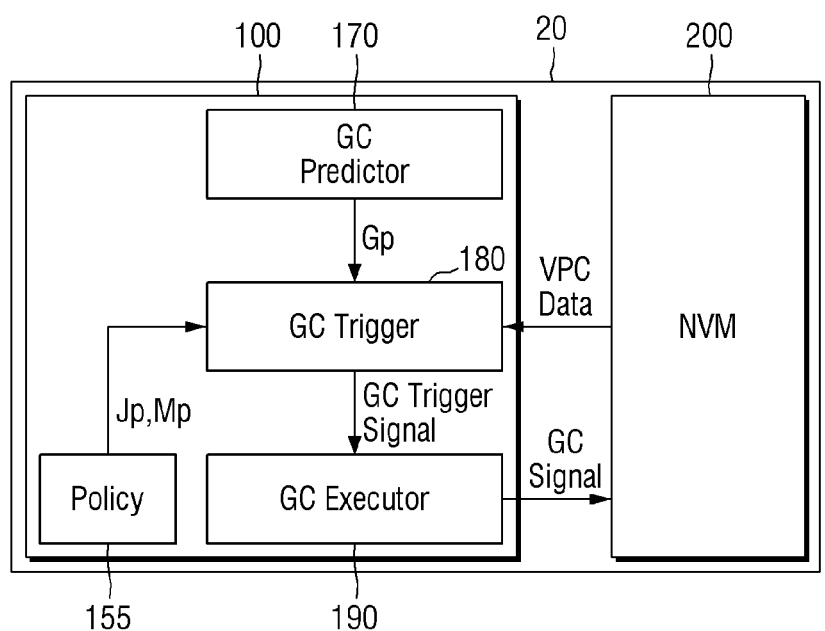
FIG. 15 is a block diagram illustrating the memory controller of the memory device according to some embodiments.

FIG. 15 is a block diagram illustrating the memory controller of the memory device according to some embodiments.

Referring to FIG. 15, memory device 20 according to some embodiments does not receive the minimum operating speed (Mp) from the host, does not receive the maximum operating speed (Jp) from the performance monitor, and further includes a control policy 155.

Control policy 155 may be built into or stored in the memory device in advance. Control policy 155 may provide the preset minimum operating speed (Mp) and the maximum operating speed (Jp) to the garbage collection trigger 180.

Control policy 155 may store the appropriate minimum operating speed (Mp) and the maximum operating speed (Jp) which are set when memory device 20 is fabricated. The minimum operating speed (Mp) and the maximum operating speed (Jp) according to control policy 155 may not change to the predetermined state.

The minimum operating speed (Mp) and the maximum operating speed (Jp) of control policy 155 of memory device 20 according to some embodiments may be changeable. That is, the minimum operating speed (Mp) and the maximum operating speed (Jp) may be determined depending on the current state of memory device 20.

For example, at least one of the temperature of memory device 20, the maximum operating speed (Jp), the garbage collection speed (Gp), and the program count of nonvolatile memory 200 may be a variable that determines the minimum operating speed (Mp). However, the present embodiment is not limited thereto.

There are various variables that determine the maximum operating speed (Jp). Instead of dynamically determining the maximum operating speed (Jp) through the current operating speed, as in performance monitor 160 in the memory controller of FIG. 13, some simple conditions may be considered to provide one of the several maximum operating speed (Jp) to garbage collection trigger 180 in the memory controller of FIG. 15.

Since memory device 20 according to the present embodiment does not depend on the minimum operating speed (Mp) received from host 10, and memory device 20 itself determines whether to perform the garbage collection, memory device 20 reduces the burden on host 10 and may voluntarily or "autonomously" execute the optimum operation without need for external control or intervention.

Furthermore, since memory device 20 according to the present embodiment does not need to separately measure the current operating speed and does not need to calculate or ascertain the maximum operating speed (Jp) dynamically changing accordingly, the overall amount of calculation performed by memory device 20 may be reduced. As a result, since the limited allocation of the resources may be performed efficiently, the overall performance of memory device 20 may be improved.

Hereinafter, the memory device according to some embodiments will be described referring to FIG. 16. The repeated part of the above description will be omitted or simplified.

Figure 16:
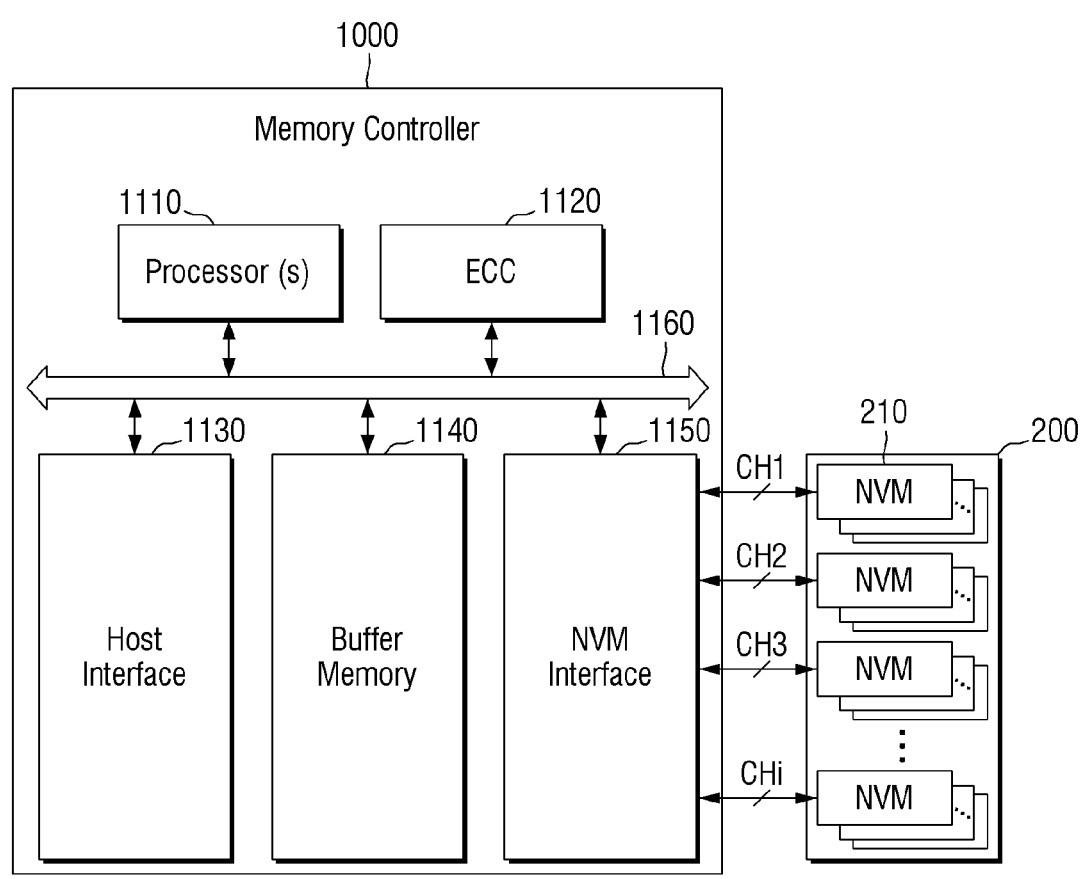
FIG. 16 is a block diagram illustrating a solid state drive (SSD) including the memory device according to some embodiments.

FIG. 16 is a block diagram illustrating a solid state drive (SSD) including the memory device according to some embodiments.

FIG. 16 illustrates an aspect in which memory device 20 according to some embodiments is applied to an SSD.

Memory device 20 includes a nonvolatile memory device 1200 and an SSD memory controller 1000. Nonvolatile memory device 1200 may include a plurality of nonvolatile memory modules 210. Each of nonvolatile memory modules 210 may be provided as nonvolatile memory 200 of FIG. 2.

SSD memory controller 1000 is connected to nonvolatile memory device 1200 via a plurality of channels (CH1 to CHi, i is an integer of 2 or more).

SSD memory controller 1000 includes at least one processor 1110, a buffer memory 1140, an error correction circuit 1120, a host interface 1130, and a nonvolatile memory interface 1150. SSD memory controller 1000 may be provided as memory controller 100 of FIG. 2. That is, although it not illustrated, SSD memory controller 1000 may include performance monitor 160, garbage collection predictor 170, garbage collection trigger 180, and garbage collection executor 190 of FIG. 6.

Buffer memory 1140 may temporarily store data necessary for the operation of SSD memory controller 1000. Buffer memory 1140 may include a plurality of memory lines which store data and commands Here, the plurality of memory lines may be mapped to the cache lines in various ways. In FIG. 16, buffer memory 1140 is located inside SSD memory controller 1000, but in other embodiments the buffer memory may also be located outside SSD memory controller 1000.

Error correction circuit 1120 calculates or ascertains the error correction code value of the data to be programmed in the write operation, performs the error correction of the data which is read in the read operation on the basis of the error correction code value, and may correct the error(s) of data recovered from nonvolatile memory 200 in the data recovery operation.

Error correction circuit 1120 may generate an error correction code (ECC) for correcting a fail bit or an error bit of data received from nonvolatile memory 200. Error correction circuit 1120 performs the error correction coding of data provided to nonvolatile memory device 1230 and may form data to which the parity bit is added. The parity bit may be stored in nonvolatile memory device 1230.

Further, error correction circuit 1120 may perform the error correction decoding on the data that is output from nonvolatile memory 200. Error correction circuit 1120 may correct the error, using the parity.

Error correcting circuit 1120 may correct the error, using coded modulation such as a low density parity check (LDPC) code, a BCH code, a turbo code, a reed-solomon code, a convolution code, a recursive systematic code (RSC), trellis-coded modulation (TCN), and block coded modulation (BCM).

Although it is not illustrated, a code memory for storing code data necessary for operating SSD memory controller 1000 may be further included. The code memory may be provided as a nonvolatile memory device.

Host interface 1130 may provide an interface function with an external device such as host 10 of FIG. 1. Host interface 1130 may be connected to host 10 via a parallel AT attachment bus (PATA), a serial AT attachment bus (SATA), a SCSI, a USB, a PCIe, a SD, a SAS, a UFS, a NAND interface, and the like.

Nonvolatile memory interface 1150 may provide an interface function with the nonvolatile memory 200.

System bus 1160 may mutually connect processor 1110, error correction circuit 1120, host interface 1130, buffer memory 1140, and nonvolatile memory interface 1150.

Hereinafter, a dynamic method of garbage collection of the memory device according to some embodiments will be described with reference to FIGS. 6, 10, 11, 17 and 18. The repeated part of the above description will be omitted or simplified.

Figure 17:
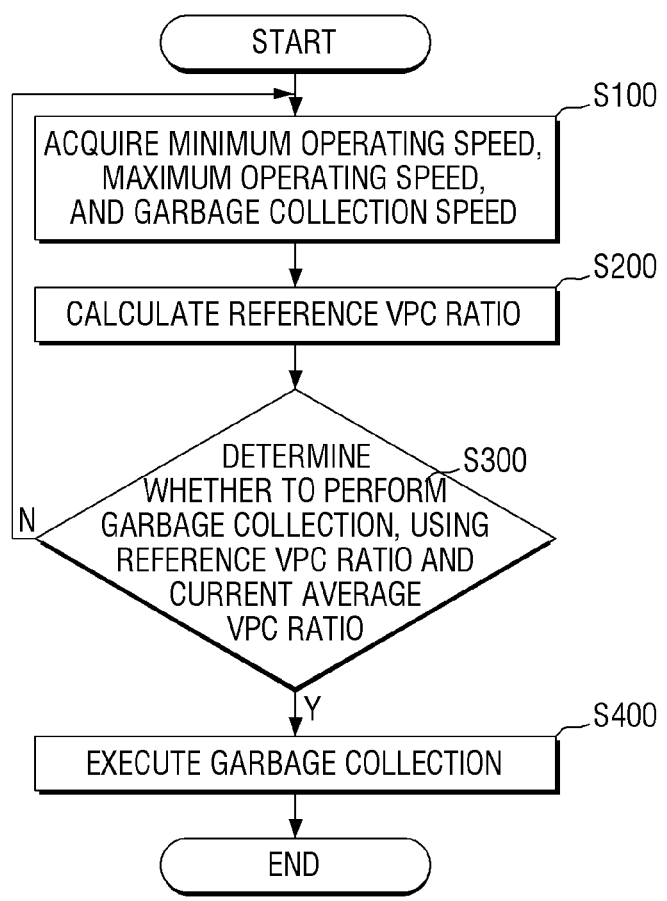
FIG. 17 is a flowchart illustrating a dynamic garbage collection method of the memory device according to some embodiments.
Figure 18:
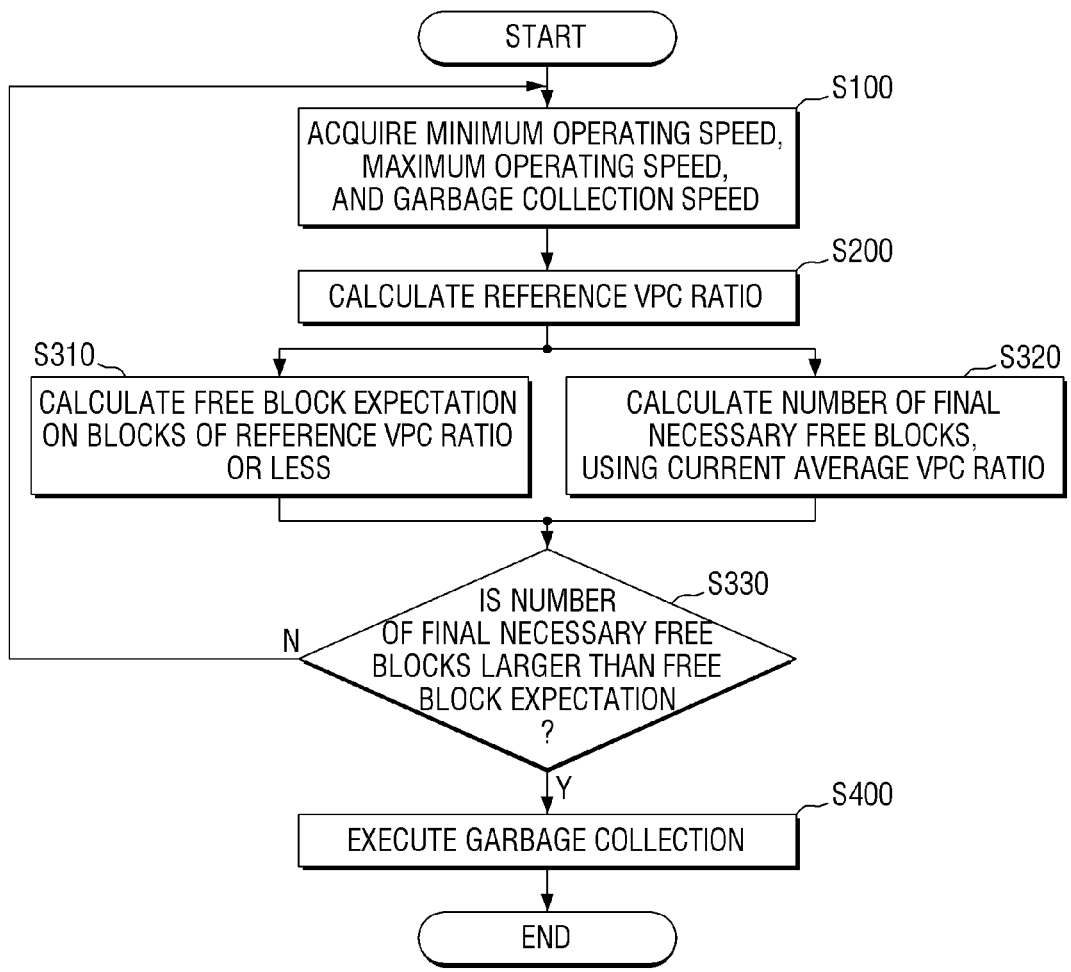
FIG. 18 is a flowchart illustrating the steps for determining whether to perform the garbage collection illustrated in FIG. 17 in detail.

FIG. 17 is a flowchart illustrating the dynamic garbage collection method of the memory device according to some embodiments, and FIG. 18 is a flow chart illustrating steps for determining whether to execute the garbage collection of FIG. 17 in detail.

Referring to FIG. 17, the minimum operating speed, the maximum operating speed and the garbage collection speed are acquired (S100).

Specifically, referring to FIG. 6, the minimum operating speed (Mp) may be transmitted to garbage collection trigger 180 from host 10. The maximum operating speed (Jp) may be transmitted to garbage collection trigger 180 from performance monitor 160. The garbage collection speed may be transmitted to garbage collection trigger 180 from garbage collection predictor 170.

The dynamic garbage collection method of the memory device according to some embodiments may, of course, be applied to FIG. 6, and the memory devices according to some embodiments of FIGS. 13 through 16.

Referring again to FIG. 17, the reference VPC ratio (CP) is calculated or ascertained (S200).

Specifically, referring to FIG. 6, the reference VPC ratio may be the maximum VPC ratio value according to Formula 6, that is, a Vr value. This is expressed by the Formula 7 as follows:

$$Cp=Gp(Jp-Mp)/(Jp*Mp+(Gp*(Jp-Mp))) \qquad \text{[Formula 7]}$$

Here, Cp is the reference VPC ratio (CP) value, Gp is the garbage collection speed (Gp), Jp is the maximum operating speed (Jp), and Mp is the minimum operating speed (Mp).

Referring again to FIG. 17, it is determined whether to perform the garbage collection using the reference VPC ratio and the current average VPC ratio (S300). An embodiment of the decision making process of step S300 will be described in greater detail with respect to FIG. 18, below.

If it is determined to execute the garbage collection, the process directly proceeds to the garbage collection execution step (S400), but if not, the process may be dynamically performed from step (S100) again.

To explain an embodiment of step S300 in detail, referring to FIG. 18, the steps of S100, S200 and S400 are the same as in FIG. 17, and the step of S300 of FIG. 17 may include the steps S310, S320 and S330 in detail.

After the step of S200, the free block expectation of the blocks having the reference VPC ratio or less is calculated or ascertained (S310).

Specifically, referring to FIG. 11, a graph of the free block expectation (Expected FB) when executing the garbage collection on the blocks of the write region (R1) which are less than the reference VPC ratio (CP) may be illustrated.

Since the garbage collection is sequentially executed beginning from the blocks with low VPC ratios, as the VPC ratio becomes higher, the free block expectation (Expected FB) may, of course, increase. The value (K) of the free block expectation (Expected FB) at the reference VPC ratio (CP) may mean the number of free blocks generated by the blocks having a VPC ratio which is less than the reference VPC ratio (CP).

At this time, the free block expectation may be derived by the sum of the invalid pages of the blocks having a VPC ratio which is less than the reference VPC ratio (CP).

Referring again to FIG. 18, after step S200, the number of the final necessary free blocks is calculated or ascertained using the current average VPC ratio (S320).

Specifically, referring to FIG. 10, when the fill ratio of the logical space is 100% in graphs ① and ②, the final physical space fill ratio of each graph may be calculated or ascertained. Of course, although this is a value analogized by the current average VPC ratio, it is possible to determine whether to perform the current garbage collection accordingly. The expected number of consumed blocks may be derived through the final physical space fill ratio.

Specifically, in the case of graph ①, by calculating or ascertaining the expected number of consumed blocks, and by excluding the total number of logical blocks (equal to the number of physical blocks corresponding to the fill ratio of 100% of the physical space) and the number of threshold blocks therefrom, the number of the final necessary free blocks may be calculated or ascertained. That is, the number of blocks corresponding to E2 may be the number of the final necessary free blocks.

Similarly, in the case of graph ②, by calculating or ascertaining the expected number of consumed blocks, and by excluding the total number of logical blocks and the number of threshold blocks therefrom, the number of the final required free blocks may be calculated or ascertained. That is, the number of blocks corresponding to E1 may be the number of the final necessary free blocks.

Referring again to FIG. 18, it is determined whether the number of the final necessary free blocks is larger than the free block expectation (S330).

If the number of the final necessary free blocks is larger than the free block expectation, the garbage collection is executed (S400), and if not, the process may return to step S100.

Various operations of methods described above may be performed by any suitable means capable of performing the operations, such as various hardware and/or software component(s), circuits, and/or module(s). Some components described above, for example performance monitor 160 and/or garbage collection predictor 170, may be implemented in different embodiments by various hardware and/or software component(s), circuits, and/or module(s), for example a processor executing software instructions stored in an associated memory device. Where software is employed, the software may comprise an ordered listing of executable instructions for implementing logical functions, and can be embodied in any "processor-readable medium" for use by or in connection with an instruction execution system, apparatus, or device, such as a single or multiple-core processor or processor-containing system. The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, or the like.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A dynamic garbage collection method of a memory device, the method comprising:
receiving a minimum operating speed for the memory device;
ascertaining a reference valid page count (VPC) ratio for the memory device, using a maximum operating speed for the memory device, the minimum operating speed for the memory device, and a garbage collection speed for the memory device, the reference VPC ratio being ascertained by a first formula;
determining whether to perform a garbage collection operation for the memory device, based on the reference VPC ratio for the memory device and a current average VPC ratio for the memory device; and
performing the garbage collection operation for the memory device when it is determined to perform the garbage collection operation based on the reference VPC ratio for the memory device and the current average VPC ratio for the memory device, wherein the first formula is:

$$Vr=Gp(Jp-Mp)/(Jp*Mp+(Gp*(Jp-Mp))),\ \text{and}$$

where, Vr is the reference VPC ratio, Gp is the garbage collection speed, Jp is the maximum operating speed, and Mp is the minimum operating speed.

2. The dynamic garbage collection method of the memory device of claim 1, wherein the minimum operating speed for the memory device is received from a host.

3. The dynamic garbage collection method of the memory device of claim 1, wherein the maximum operating speed for the memory device is ascertained based on a current operating speed for the memory device.

4. The dynamic garbage collection method of the memory device of claim 1, wherein determining whether to execute the garbage collection operation for the memory device comprises:
 ascertaining a free block expectation on blocks of the memory device which have a VPC ratio which is less than or equal to the reference VPC ratio;
 ascertaining a number of final necessary free blocks, using the current average VPC ratio for the memory device; and
 comparing the free block expectation with the number of the final necessary free blocks.

5. The dynamic garbage collection method of the memory device of claim 4, wherein ascertaining the number of final necessary free blocks comprises:
 ascertaining an expected number of consumed blocks by assuming the average VPC ratio for the memory device as a whole VPC ratio for the memory device; and
 excluding a total number of logical blocks and a number of threshold blocks from the expected number of consumed blocks to ascertain the number of final necessary free blocks.

6. The dynamic garbage collection method of the memory device of claim 4, wherein ascertaining the expectation of the free block comprises:
 ascertaining a sum of invalid pages of the blocks of the memory device which have a VPC ratio which is less than the reference VPC ratio for the memory device.

7. A dynamic garbage collection method of a memory device, the method comprising:
 ascertaining a reference valid page count (VPC) ratio for the memory device, using a maximum operating speed for the memory device, a minimum operating speed for the memory device, and a garbage collection speed for the memory device;
 ascertaining a free block expectation on blocks of the memory device which have a VPC ratio which is less than or equal to the reference VPC ratio for the memory device;
ascertaining a number of final necessary free blocks, using a current average VPC ratio for the memory device;
 comparing the free block expectation with the number of final necessary free blocks to determine whether to perform a garbage collection operation for the memory device; and
 performing the garbage collection operation for the memory device when it is determined to perform the garbage collection operation based on a comparison of the free block expectation and the number of final necessary free blocks.

8. The dynamic garbage collection method of the memory device of claim 7, wherein ascertaining the reference VPC ratio for the memory device comprises:
 defining the reference VPC ratio as a VPC ratio when a free page production speed is equal to the minimum operating speed for the memory device.

9. The dynamic garbage collection method of the memory device of claim 8, wherein the reference VPC ratio for the memory device has a value greater than or equal to 0 and less than or equal to 1.

10. The dynamic garbage collection method of the memory device of claim 7, wherein the minimum operating speed for the memory device is received from a host.

11. The dynamic garbage collection method of the memory device of claim 7, wherein the minimum operating speed for the memory device is determined by a preset policy stored within the memory device.

12. The dynamic garbage collection method of the memory device of claim 7, wherein the maximum operating speed is ascertained by a current operating speed for the memory device.

13. The dynamic garbage collection method of the memory device of claim 7, wherein the maximum operating speed for the memory device is determined by a preset policy stored within the memory device.

14. The dynamic garbage collection method of the memory device of claim 7, further comprising:
 when the free block expectation is greater than the number of the final necessary free blocks, not executing the garbage collection operation for the memory device, and when the free block expectation is less than the number of final necessary free blocks, performing the garbage collection operation for the memory device.

15. A dynamic garbage collection method of a memory device, the method comprising:
 receiving at the memory device from a host a first minimum operating speed for the memory device at a first time;
 ascertaining a first reference valid page count (VPC) ratio for the memory device, using a first maximum operating speed for the memory device, the first minimum operating speed for the memory device, and a first garbage collection speed for the memory device;
 determining whether to perform a first garbage collection operation for the memory device using the first reference VPC ratio for the memory device and a current first average VPC ratio for the memory device; and
 when it is determined not to perform the first garbage collection operation for the memory device at the first time:
  receiving at the memory device from the host a second minimum operating speed for the memory device at a second time different from the first time, ascertaining a second reference VPC ratio for the memory device, using a second maximum operating speed for the memory device, the second minimum operating speed for the memory device, and a second garbage collection speed for the memory device,
  determining whether to perform a second garbage collection operation for the memory device, using the second reference VPC ratio for the memory device and a current second average VPC ratio for the memory device, and
  performing the second garbage collection operation for the memory device when it is determined to perform the second garbage collection operation based on a comparison of the second reference VPC ratio for the memory device and the current second average VPC ratio for the memory device.

16. The dynamic garbage collection method of the memory device of claim 15, wherein the first garbage collection speed and the second garbage collection speed are equal to each other.

17. The dynamic garbage collection method of the memory device of claim 15, further comprising:
when it is determined not to perform the second garbage collection for the memory device at the second time
receiving a third minimum operating speed for the memory device from the host at a third time different from the first time and second time,
ascertaining a third reference VPC ratio for the memory device, using a third maximum operating speed for the memory device, the third minimum operating speed for the memory device, and a third garbage collection speed for the memory device, and
determining whether to execute a third garbage collection for the memory device, using the third reference VPC ratio for the memory device and a current third average VPC ratio for the memory device.

18. The dynamic garbage collection method of the memory device of claim 15, wherein the first maximum operating speed for the memory device is ascertained based on a first operating speed for the memory device at the first time, and the second maximum operating speed is ascertained based on a second operating speed of the second time.

19. The dynamic garbage collection method of the memory device of claim 15, wherein determining whether to execute the first garbage collection operation for the memory device using the first reference VPC ratio for the memory device comprises:
ascertaining a first free block expectation on blocks of the memory device which have a VPC ratio which is less than or equal to the first reference VPC ratio;
ascertaining a number of first final necessary free blocks, using the current first average VPC ratio for the memory device at the first time; and
comparing the first free block expectation with the number of first final necessary free blocks.

20. The dynamic garbage collection method of the memory device of claim 19, further comprising:
when the first free block expectation is greater than the number of first final necessary free blocks, not performing the first garbage collection for the memory device, and when the first free block expectation is less than the number of first final necessary free blocks, performing the first garbage collection for the memory device.

* * * * *